(12) United States Patent
Bieg et al.

(10) Patent No.: US 7,684,125 B2
(45) Date of Patent: Mar. 23, 2010

(54) DIAPHRAGM CHANGING DEVICE

(75) Inventors: Hermann Bieg, Aalen (DE); Thomas Bischoff, Aalen (DE); Uy-Liem Nguyen, Dattwill (CH); Stefan Xalter, Oberkochen (DE); Marcus Will, Neu-Ulm (DE); Yim-Bum Patrick Kwan, Aalen (DE); Michael Muehlbeyer, Aalen (DE)

(73) Assignee: Carl Zeiss SMT AG (DE)

( * ) Notice: Subject to any disclaimer, the term of this patent is extended or adjusted under 35 U.S.C. 154(b) by 627 days.

(21) Appl. No.: 10/595,583

(22) PCT Filed: Dec. 18, 2003

(86) PCT No.: PCT/EP03/14551
§ 371 (c)(1),
(2), (4) Date: Apr. 28, 2006

(87) PCT Pub. No.: WO2005/050322
PCT Pub. Date: Jun. 2, 2005

(65) Prior Publication Data
US 2007/0053076 A1    Mar. 8, 2007

(30) Foreign Application Priority Data
Oct. 29, 2003   (DE) ............................... 103 50 545

(51) Int. Cl.
*G02B 9/00* (2006.01)

(52) U.S. Cl. ..................................... 359/739; 359/738

(58) Field of Classification Search ......... 359/738–739, 359/811–820
See application file for complete search history.

(56) References Cited

U.S. PATENT DOCUMENTS

| | | | | |
|---|---|---|---|---|
| 5,646,770 A | * | 7/1997 | Sato et al. | 359/230 |
| 5,926,324 A | * | 7/1999 | Oono et al. | 359/696 |
| 6,445,510 B1 | * | 9/2002 | Schuster et al. | 359/739 |
| 6,639,696 B1 | | 10/2003 | Nishio | |

FOREIGN PATENT DOCUMENTS

| | | |
|---|---|---|
| DE | 19955984 A1 | 5/2001 |
| DE | 10111299 A1 | 9/2002 |
| EP | 0969327 A2 | 1/2000 |
| JP | 5234850 A | 9/1993 |
| JP | 10125590 A | 5/1995 |
| JP | 2002509654 A | 3/2002 |
| JP | 2002203767 A | 7/2002 |
| WO | 9957606 A1 | 11/1999 |

* cited by examiner

*Primary Examiner*—Ricky L Mack
*Assistant Examiner*—James R Greece
(74) *Attorney, Agent, or Firm*—GrayRobinson, P.A.

(57) ABSTRACT

The invention relates to an optical imaging device, in particular an objective 1 for microlithography in the field of EUVL for producing semiconductor components, having a beam path 2, a plurality of optical elements 3 and a diaphragm device 7 with an adjustable diaphragm opening shape. The diaphragm device has a diaphragm store 7a, 7b with a plurality of different diaphragm openings 6 with fixed shapes in each case, which can be introduced into the beam path 2.

26 Claims, 11 Drawing Sheets

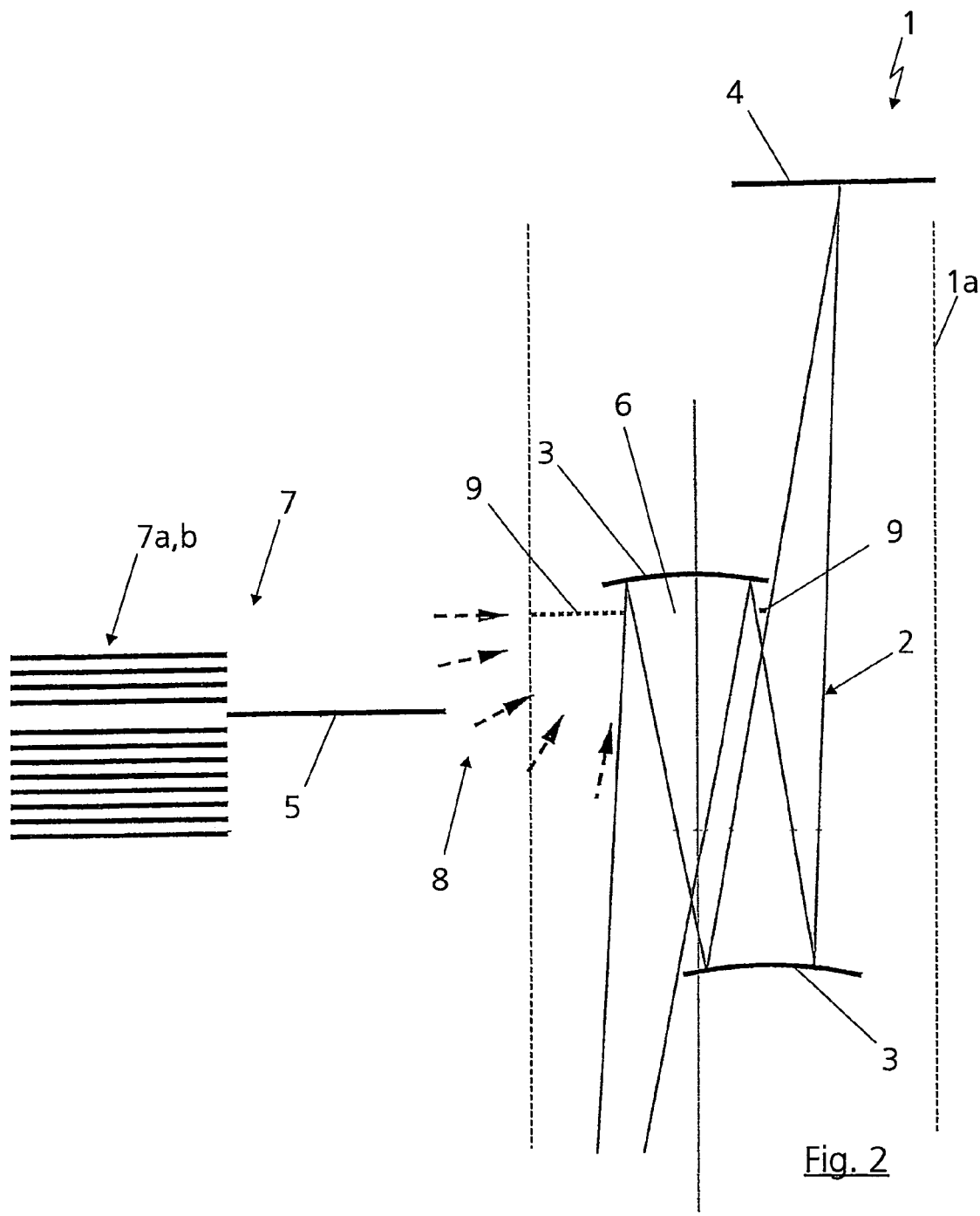

DIAPHRAGM CHANGING DEVICE

BACKGROUND OF THE INVENTION

1. Field of the Invention

The invention relates to an optical imaging device, in particular an objective for microlithography in the field of EUVL for producing semiconductor elements, having a beam path, a plurality of optical elements and a diaphragm device with an adjustable diaphragm opening shape.

2. Description of the Related Art

It is generally known to use various diaphragms as system diaphragms in optical imaging devices. The diameter of the light beam bundle in the beam path of the optical imaging device can be varied by means of these diaphragms, of which the opening diameter can be varied, in particular.

So-called iris diaphragms, which have at least four—but mostly more—thin blades which are generally in the shape of a sickle and are supported at one end rotatably in a fixed mount are particularly widespread. In this arrangement, the other end is provided as guiding device with a pin which is inserted in a groove or slot of a rotatable ring such that the rotation of the rotatable ring moves the blades in such a way that the remaining opening diameter for the diaphragm can be varied.

DE 101 11 299 A1 discloses such an iris diaphragm, in particular for an exposure objective in semiconductor lithography, having a plurality of blades which are guided with the aid of guide elements, and can be moved by at least one drive device for the purpose of adjusting the diaphragm opening. The guide elements are designed such that the blades can be moved in an at least approximately linear fashion in a radial direction in relation to the optical axis of the iris diaphragm.

DE 199 55 984 A1 discloses a further diaphragm for stopping down an optical imaging device.

Known diaphragms, in particular the iris diaphragms which can be adjusted continuously via blades, are less suitable for use in stopping down an optical system used in microlithography, chiefly in the field of EUVL, since more stringent demands are placed here on the installation space available, which these cannot satisfy because of their construction.

SUMMARY OF THE INVENTION

It is therefore the object of the present invention to create an optical imaging device of the type mentioned at the beginning which can be stopped down with the aid of a diaphragm which requires only a small installation space.

This object is achieved according to the invention by virtue of the fact that the diaphragm device has a diaphragm store with a plurality of different diaphragm openings with fixed shapes in each case, which can be introduced into the beam path.

The measures according to the invention create in a simple and advantageous way an optical imaging device having a diaphragm mechanism in the case of which the shapes of the diaphragm openings are permanently determined and can be stored in a very small space. There are no restrictions on the geometry of the shapes of the diaphragm openings, and so both circular and elliptical or other geometries can be used for the diaphragm openings. By contrast with the known blade-type iris diaphragms, the masses to be moved are comparatively small, and so changing the diaphragms in the optical imaging device can be undertaken very quickly. The most varied types of diaphragms can be brought into use by means of the existing diaphragm store with diaphragm openings.

It is very advantageous when the diaphragm store is designed as a revolving disc diaphragm stack, in particular arranged outside the optical imaging device, with a plurality of revolving disc diaphragms which are provided with diaphragm openings and are, in particular, accommodated in separate plug-in units.

These measures yield a further space-saving design of the diaphragm device, in particular outside the optical imaging device, as a result of which comparatively many different revolving disc diaphragms can be stored in the revolving disc diaphragm stack. By contrast with an inner arrangement, the arrangement of the diaphragm device outside the optical imaging device additionally minimizes contamination of the optical imaging device by the diaphragm device. Moreover, the diaphragm device can be dynamically decoupled from the optical imaging device such that no disturbing vibrations are introduced by the diaphragm device to the optical elements arranged in the optical imaging device.

Moreover, it can be provided in one structural configuration of the invention that a sheet-metal strip which is wound onto two rollers and held tensioned is provided as a diaphragm store, the sheet-metal strip having a plurality of, in particular, various diaphragm openings of fixed shapes, and it being possible by rotating the rollers to adjust the diaphragm setting by varying the diaphragm openings.

This results in a very highly dynamic adjustment of the various diaphragms, which can be stored in a very small space. The masses to be moved are comparatively small and there are no restrictions on the geometry of the diaphragm openings. Changing diaphragms can be undertaken speedily.

Advantageous refinements and developments of the invention arise from the further subclaims. Various embodiments of the invention are explained in principle below with the aid of the drawings.

BRIEF DESCRIPTION OF THE DRAWINGS

FIG. 1b shows a view from above of a revolving disc diaphragm suitable for the projection objective in accordance with FIG. 1a;

FIG. 2 shows an illustration of a revolving disc diaphragm stack with a plurality of revolving disc diaphragms which can be introduced into the beam path of the projection objective in accordance with FIG. 1a;

DETAILED DESCRIPTION

Figure 1A:
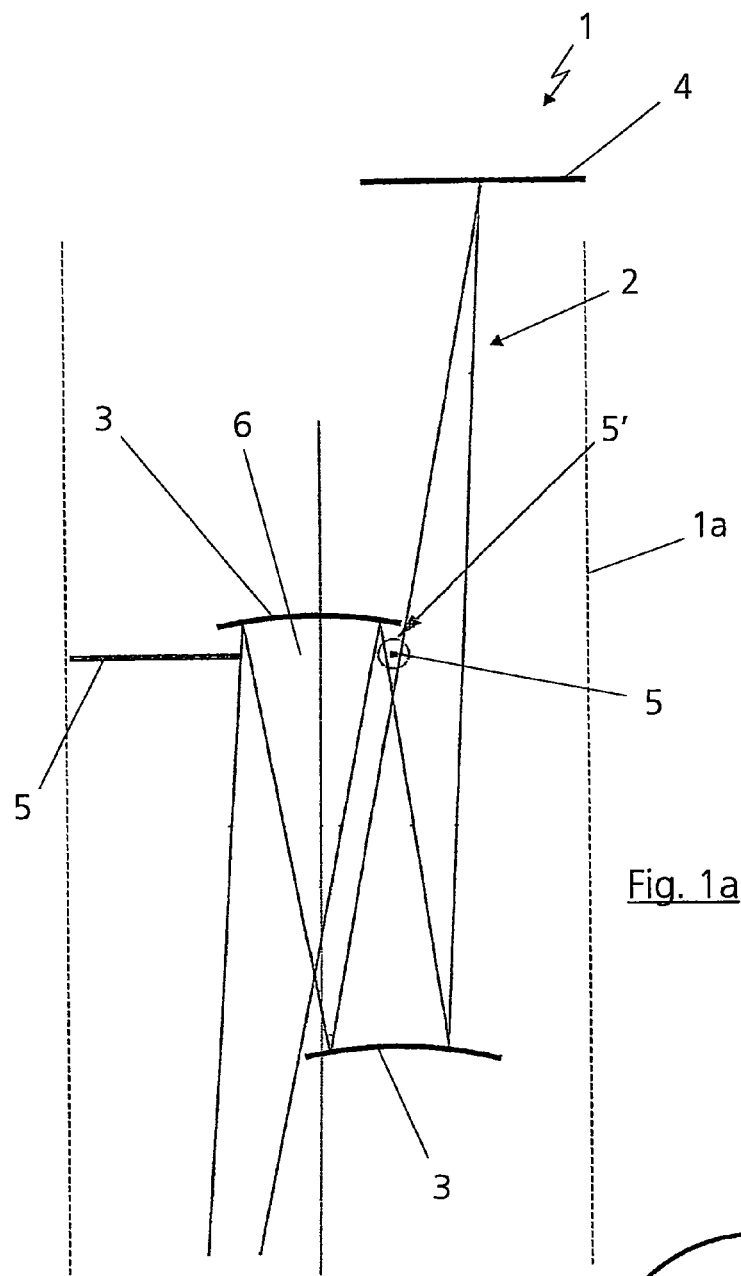
FIG. 1a shows a detail of a projection objective for microlithography in the field of EUVL, with a typical beam path.
Figure 14:
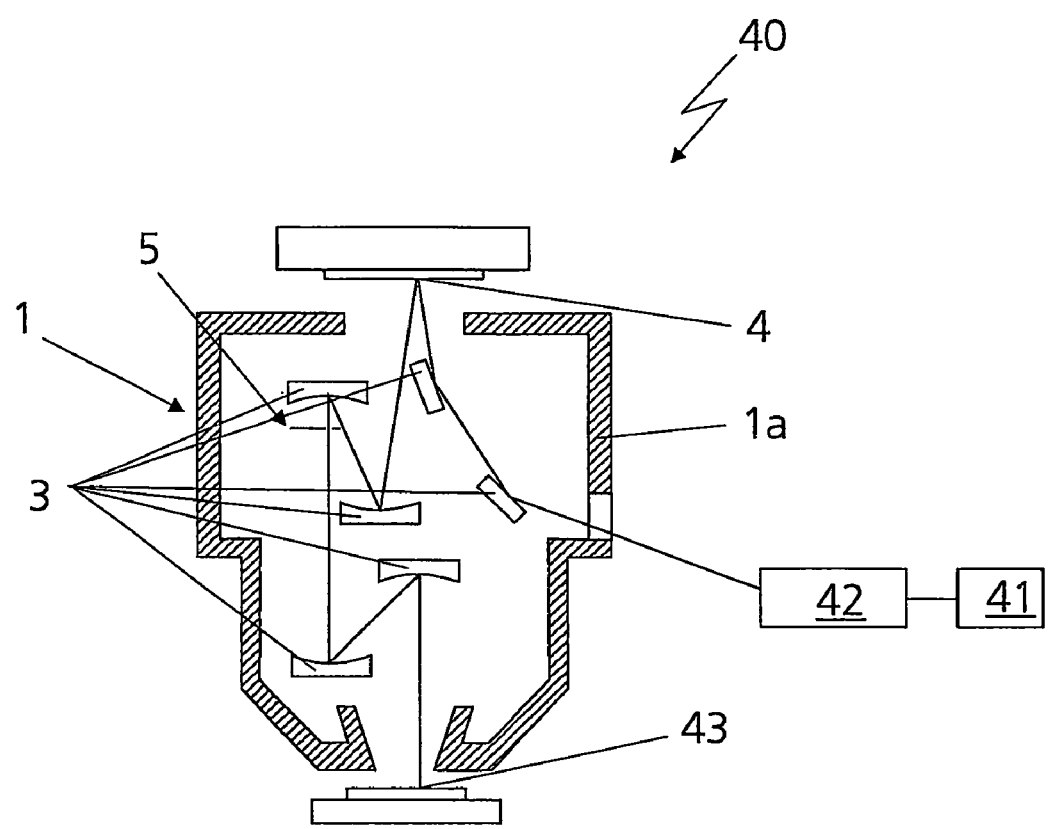
FIG. 14 shows the principle of the design of an EUV projection exposure machine with a light source, an illuminating system and a projection objective.

FIG. 1a shows a detail of a projection objective 1 for use in the field of EUVL, with its typical beam path 2 between mirrors 3 arranged on a housing 1a, illustrated by dashes, of the projection objective 1, and an object plane 4 (explained in more detail in FIG. 14). Arranged in the beam path 2 is a diaphragm 5 with a diaphragm opening 6 which serves to stop down the light beam of the projection objective 1.

Figure 1B:
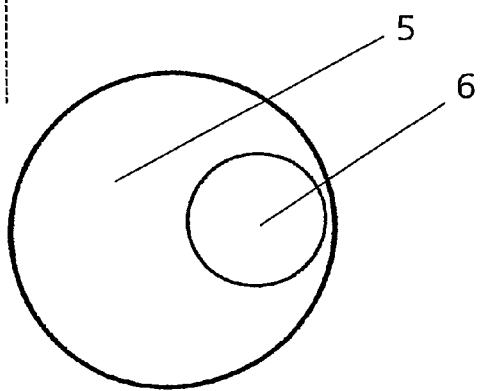

As may be seen, stringent requirements are placed on the nature and the installation space of the diaphragm 5 here. This is required principally on a side 5' of the diaphragm 5 that is emphasized by a circle. Consequently, the diaphragm opening 6 should be decentral as illustrated in FIG. 1b. This requisite arrangement of the diaphragm opening 6 on the diaphragm 5, as well as the small installation space in the projection objective 1 complicate the use of conventional, continuously adjustable iris diaphragms (for example, by means of blades) in the case of such a projection objective 1, in particular in the case of operating wavelengths in the field of EUVL.

FIG. 2 shows the detail of the projection objective 1 in a design with a diaphragm device 7 with a revolving disc diaphragm stack 7a, 7b, which has individual diaphragms 5, designed as revolving disc diaphragms, with fixed geometries (see FIG. 1b) stacked vertically one above another. The diaphragm openings 6 can also have elliptical or other shapes instead of the circular shape illustrated. The revolving disc diaphragms 5 are preferably brought into the beam path 2 of the projection objective 1 to an operating position 9 (indicated by dots) provided therefor via directions indicated by arrows 8. As may be seen from FIG. 1b, the revolving disc diaphragms 5 are shaped in such a way that they have a thin rim on the side of the neighbouring light beam, and a broad rim over the remainder of the circumference.

Figure 3A:
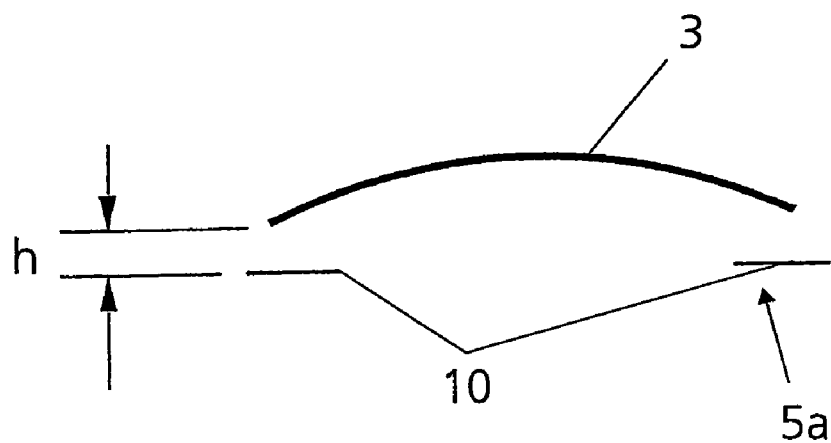
FIGS. 3a to 3c show side views of three embodiments of a revolving disc diaphragm.
Figure 3B:
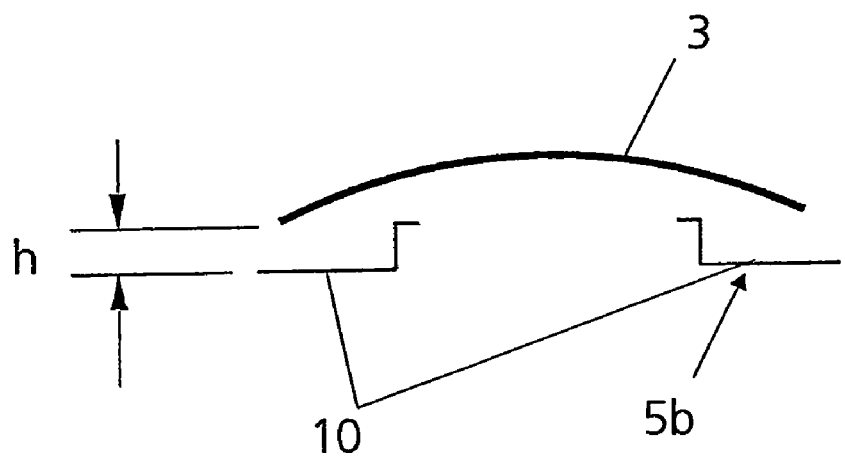
Figure 3C:
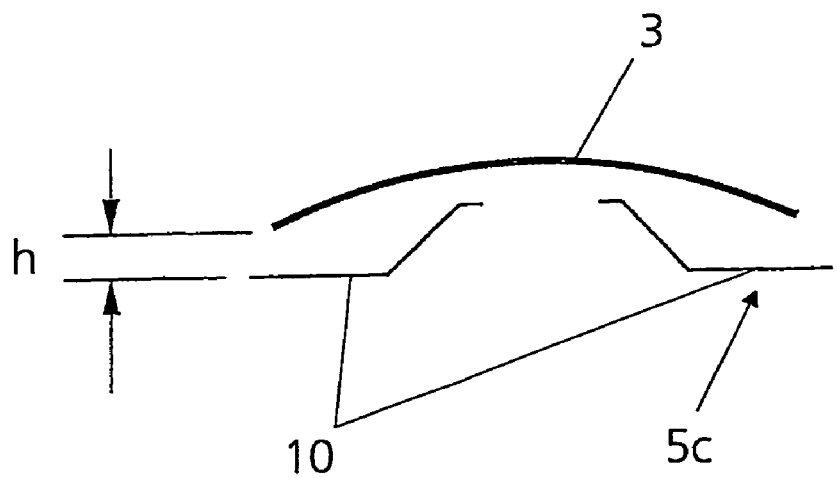

As may be seen in FIGS. 3a to 3c, the optimum physical spacing of revolving disc diaphragms 5a to 5c is different for different sizes of diaphragm in relation to the mirrors 3 arranged upstream thereof in the beam direction. In order to be able to ensure this when mounting the revolving disc diaphragms 5a to 5c at a uniform height h with reference to the mirrors 3, the latter are provided with different heights with reference to the ranges 10 of their mountings.

Figure 4A:
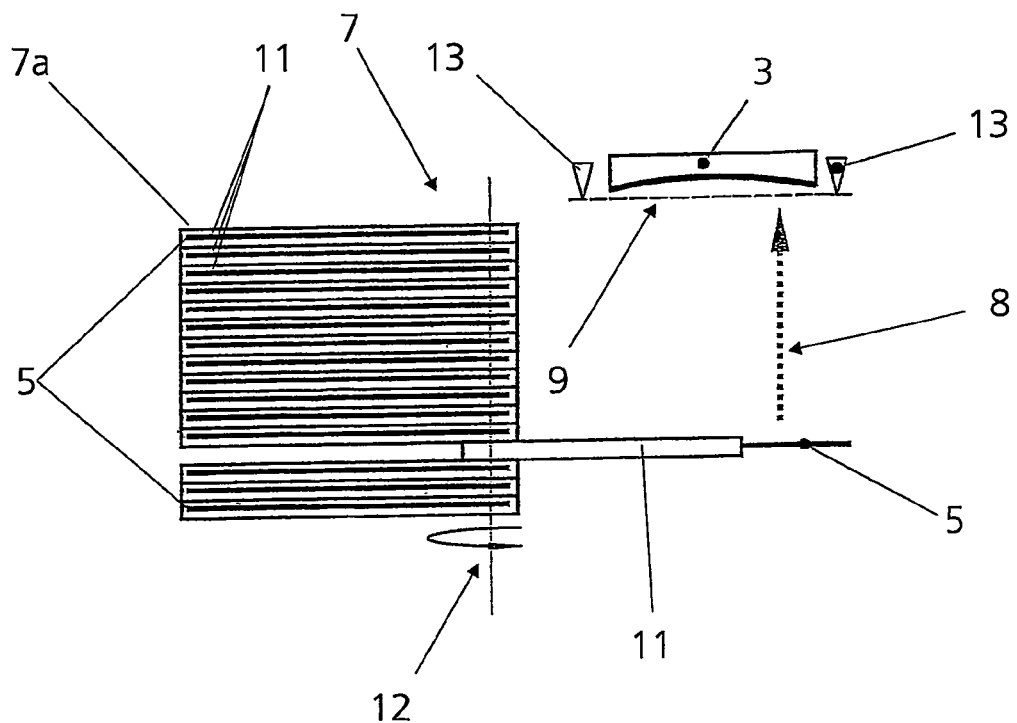
FIGS. 4a to 4c show illustrations of three embodiments of a diaphragm device with a revolving disc diaphragm stack.

As illustrated in FIG. 4a, the revolving disc diaphragm stack 7a has a plurality of revolving disc diaphragms 5 which are accommodated in separate plug-in units 11. Each plug-in unit 11 can be rotated out (indicated by the arrow 12 in FIG. 4a) individually by means of an articulated element (not illustrated) common to all the plug-in units 11, such that in each case one revolving disc diaphragm 5 can be rotated out in order subsequently to be lifted (indicated in FIG. 4a by the dotted arrow 8) into the beam path 2 of the projection objective 1 to its operating position 9, as explained at a later point in time. The swivelling movement of the plug-in units 11 can be accomplished by means of a gearwheel drive which is fitted on a lifting mechanism or a module housing and can be arranged in such a way that it moves the gearwheel teeth as the plug-in unit 11 passes. Alternatively, in other exemplary embodiments it would also be possible to provide other drive mechanisms, in particular friction wheels, magnetic clutches or special electric motors with rotors which are installed in the plug-in units 11.

In the present exemplary embodiment, the plug-in units 11 have a uniform overall height. In other exemplary embodiments, however, these can also differ in order to be able to use various sizes of diaphragm (compare FIGS. 3a to 3c).

After the operating position 9 of the revolving disc diaphragm 5 is reached, the latter is coupled to a holding device or to a stop 13. The holding device 13 permits a repeatably accurate positioning of the revolving disc diaphragms 5 in the micrometre range. This reduces the accuracy requirements for the separate plug-in units 11, and also for the overall lifting mechanism (indicated by the arrow 8).

Figure 4B:
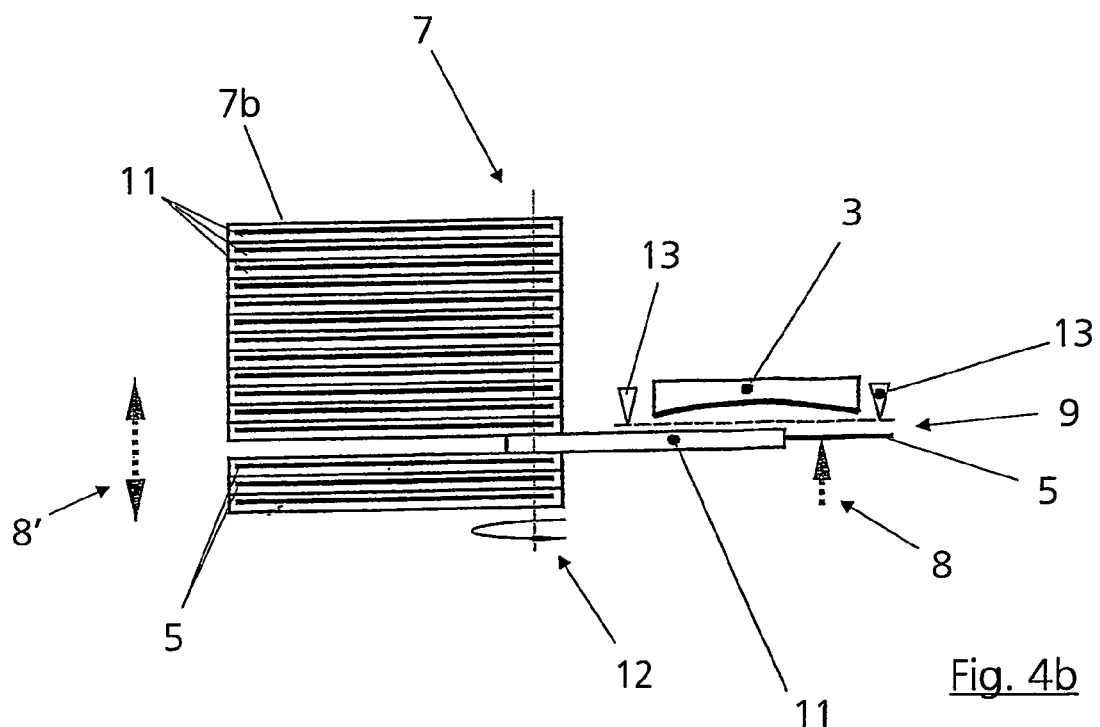
Figure 4C:
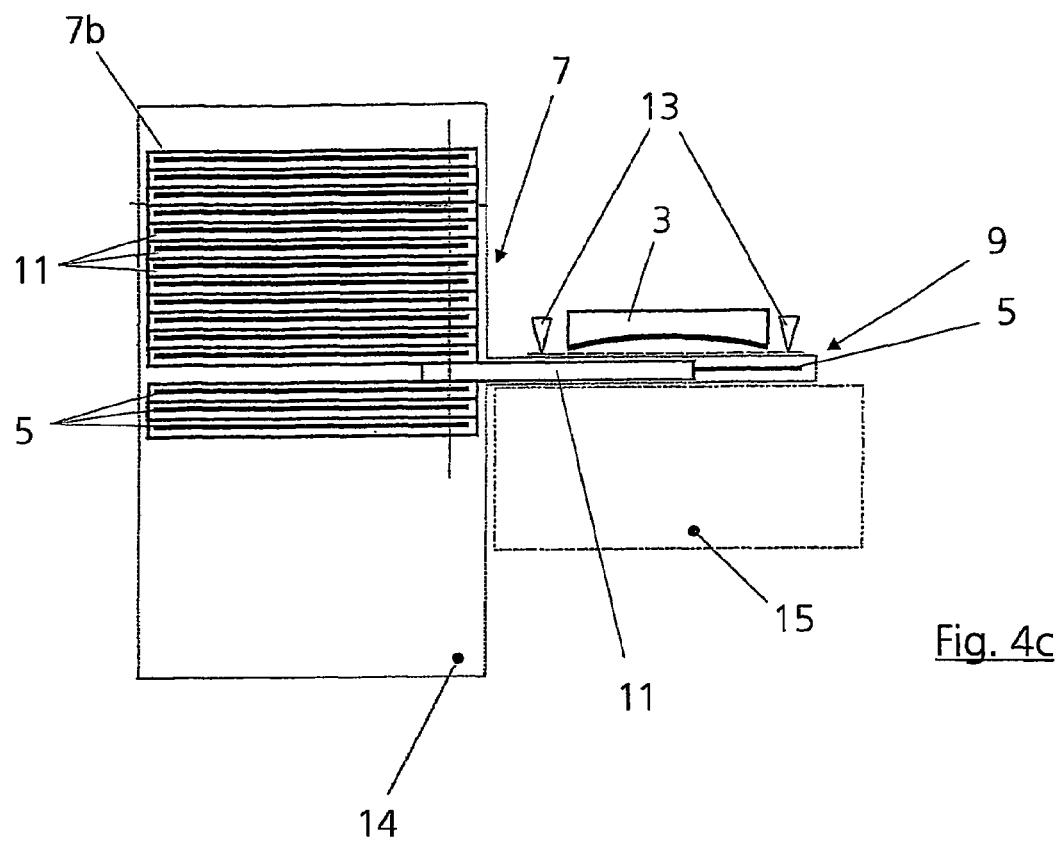

As may be seen from FIG. 4b, instead of lifting the revolving disc diaphragms 5 to the operating position 9 it is also possible in a further embodiment to move a revolving disc diaphragm stack 7b vertically (indicated by the arrow 8') until the appropriate revolving disc diaphragm 5 has reached substantially the same height as the holding device 13, after which the plug-in unit 11 with the appropriate revolving disc diaphragm 5 is rotated out and coupled to the holding device 13 after a possible additional slight vertical movement (arrow 8). This embodiment has the advantage that the diaphragm exchange mechanism requires only very little space in front of the mirror 3, the result being to release this space for additional systems (mirror cleaning systems etc.). An operating range 14 of the vertically displaceable revolving disc diaphragm stack 7b is illustrated by dashes or dots and dashes in FIG. 4c, as is a free region for additional systems 15.

Especially for the field of EUVL, projection objectives 1 are very sensitive to movements of their individual optical elements, for example mirror 3, both relative to one another and relative to the structure of their mountings. In order to minimize the transmission of interfering vibrations, the projection objective 1 is isolated from vibrations. Moreover, the individual elements inside the projection objective 1 are connected to one another rigidly (with a high natural frequency) in such a way that they move with one another as a rigid body when excited by any residual vibrations, which are usually of low frequency.

It is a complicated undertaking to create an embodiment of the overall diaphragm device 7 with a sufficiently high natural frequency, since relatively large masses have to be moved and the installation space is restricted. Consequently, dynamic movements (vibrations) would be transmitted to the overall projection objective 1 by the diaphragm device 7. The relative positioning of the diaphragm 5 in relation to the remaining optical elements of the projection objective 1 is less critical in general, however.

A possible solution to this problem is for the entire diaphragm device 7 to be mounted on a separate structure dynamically decoupled from the projection objective 1, but this would make positioning the diaphragm exactly in the projection objective 1 more difficult.

A further solution consists in separating the selected revolving disc diaphragm 5 with the holding device 13 from the remainder of the diaphragm device 7 (revolving disc diaphragm stacks 7a, 7b, plug-in units 11, lifting mechanism, housing, etc.) and arranging them on different structures, the holding device 13 being fastened directly on the optical imaging device or on the projection objective 1. The remainder of the diaphragm device 7 can be mounted on a separate structure.

A further possible solution consists in fastening both the holding device 13 and the lifting mechanism 16 on the projection objective 1, while the remainder of the diaphragm device 7 is mounted on a separate structure.

The holding device 13 ensures that the revolving disc diaphragm 5 is positioned accurately relative to the projection objective 1 and in six degrees of freedom.

Furthermore, there is also a need to hold or lock the revolving disc diaphragms 5 in the holding device 13 against the gravity force and other interfering forces. In order to prevent particles from contaminating the mirror surfaces, the revolving disc diaphragm 5 should be locked as gently as possible.

Figure 5:
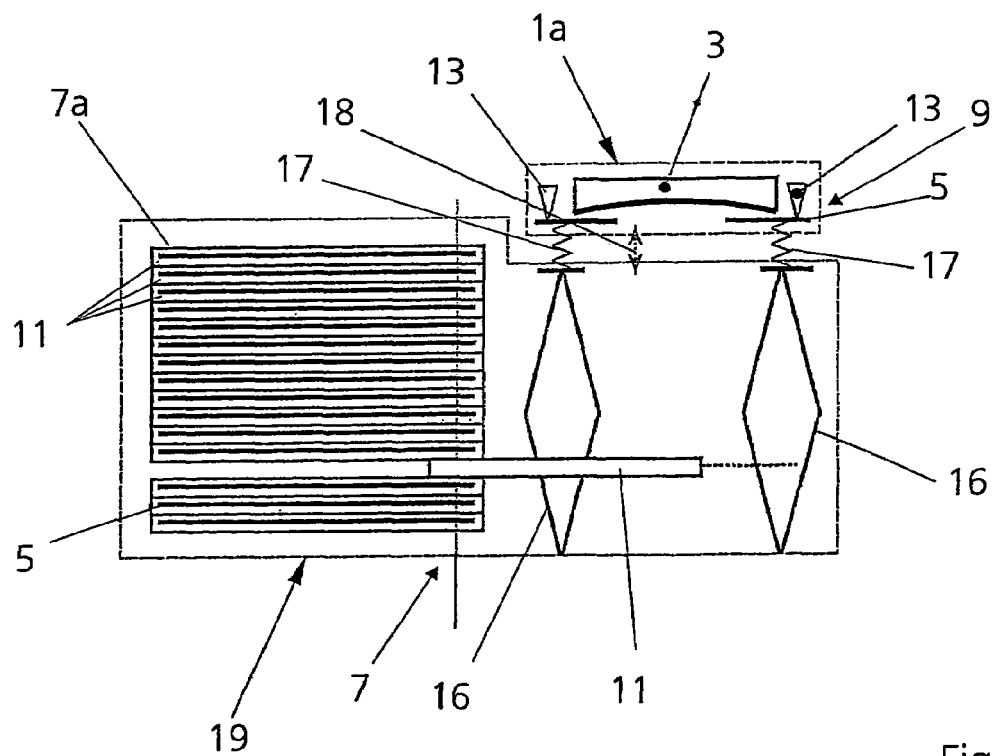
FIG. 5 shows a view of a diaphragm device with a lifting device, a holding device and with spring elements as stop for a revolving disc diaphragm.

As sketched in FIG. 5, the revolving disc diaphragm 5 is conveyed by means of a lifting device 16 from a removal position into its operating position 9, and held there in the holding device 13. In the case of the diaphragm device 7 illustrated in FIG. 5, use was advantageously made of mainly rotary mechanisms in the diaphragm exchange mechanism since, by contrast with translation mechanisms, fewer particles causing contamination, for example, by friction forces, are produced. As illustrated further in FIG. 5, the essentially constant force for holding the revolving disc diaphragm 5 in the holding device 13 is effected in a simple and advantageous way by spring elements 17 of low stiffness. The spring elements 17 should be precompressed in order to avoid a large compression deflection of the spring elements 17 relative to the operating position 9 of the revolving disc diaphragm 5. An arrow 18 indicates the dynamic decoupling or the vibrational decoupling of the separately-mounted housing 1a of the projection objective 1 (indicated by dashes) and of the remainder of the diaphragm mechanism (dashed box 19), likewise mounted separately.

Figure 6A:
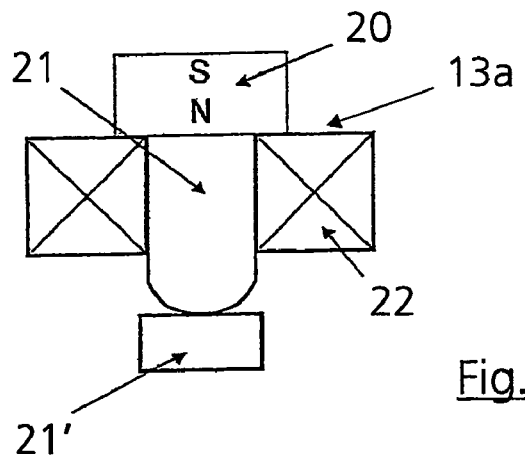
FIGS. 6a to 6c show illustrations of three embodiments of electromagnetic holding devices for positioning the revolving disc diaphragm.
Figure 6B:
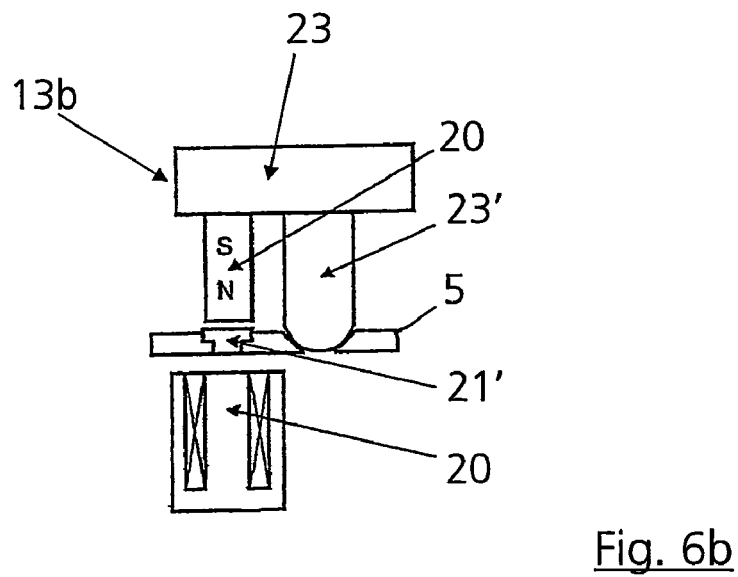
Figure 6C:
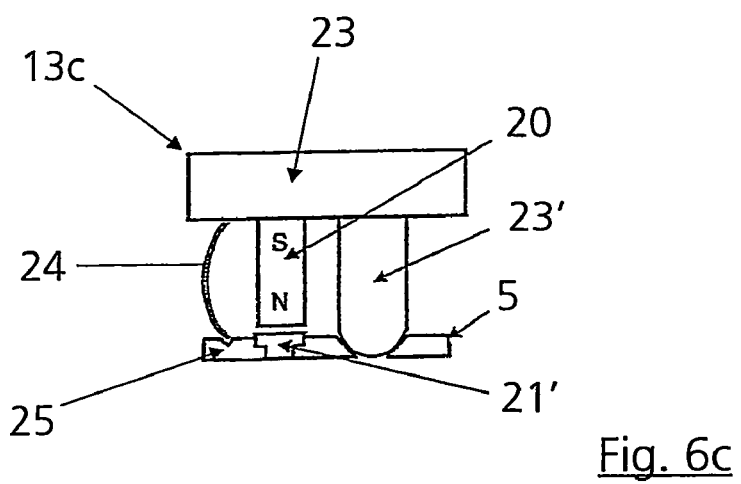

FIGS. 6a to 6c illustrate various embodiments of the holding device 13 for fixing and/or positioning the revolving disc diaphragm 5.

As may be seen from FIG. 6a, a holding device 13a has a permanent magnet 20 and a soft iron core 21 with a coil winding 22. The revolving disc diaphragms 5 (not illustrated in more detail here) likewise have a soft iron core 21' on the opposite side and are thereby held via magnetic forces. This has the advantage that there are only a few or no open mechanically moveable parts which could lead to further instances of particle contamination.

As is illustrated in FIG. 6b, a holding device 13b is provided on a part 23, and has a static part 23' and the permanent magnet 20. The revolving disc diaphragm 5 has the soft iron core 21 by means of which the revolving disc diaphragm 5 is held on the holding device 13b. In addition, the lifting device 16 (not illustrated in more detail in FIG. 6b) has a switchable electromagnet 20' which is switched in the event of an exchange of diaphragms in such a way that the diaphragm is loosened from the holding device 13b.

Illustrated in FIG. 6c is a third embodiment of a holding device 13c which corresponds in essence to the holding device 13b from FIG. 6b. A soft spring element 24 which engages in a cut-out 25 in the revolving disc diaphragm 5 has been inserted here in addition.

Figure 7A:
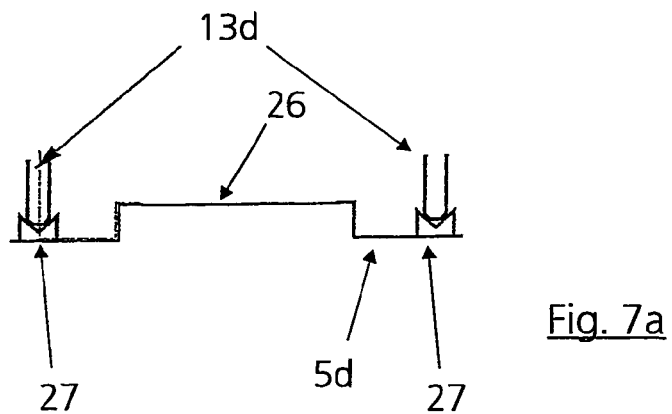
FIGS. 7a and 7b show illustrations of two embodiments of a contamination monitoring means for a mirror.

FIG. 7a shows a holding device 13d with a revolving disc diaphragm 5d. A mirror contamination monitoring means is provided here, in addition. This is effected by fine tungsten lead wires 26 which are guided via the opening in the revolving disc diaphragm 5. The revolving disc diaphragm 5d is fabricated for this purpose from an insulating material such as, for example, a ceramic or similar. The electrical connection with the tungsten lead wires 26 is achieved by three contact points on bearing points 27 of the revolving disc diaphragm 5d.

Figure 7B:
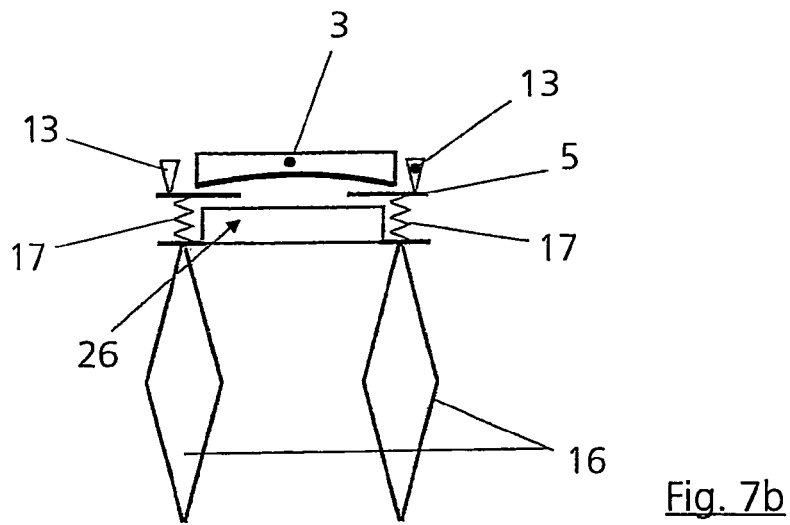

FIG. 7b shows an alternative embodiment of a contamination monitoring means. Here, the tungsten lead wires 26 are integrated in the lifting device 16.

Figure 8:
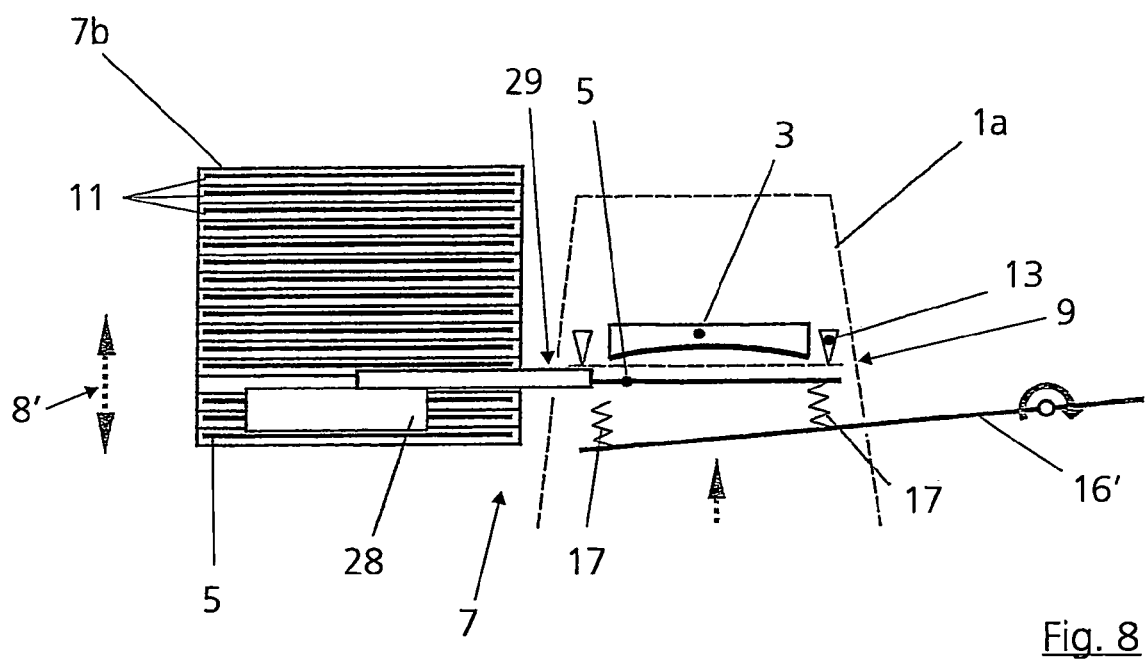
FIG. 8 shows a side view of an inventive external diaphragm device with a lifting device.

As may be seen from FIG. 8, the vertically displaceable revolving disc diaphragm stack 7b is arranged outside the projection objective 1 or the housing 1a thereof. This protects the projection objective 1 against contamination by the revolving disc diaphragm stack 7b. The revolving disc diaphragm stack 7b is provided with a feeder device 28 which is designed as a moveable robot gripper arm, removes the corresponding revolving disc diaphragm 5 from the revolving disc diaphragm stack 7b and inserts it into the beam path 2 of the projection objective 1 through an opening 29 provided for the purpose. An additional lifting device 16' (illustrated in a simplified fashion), likewise arranged outside the projection objective 1, conveys the revolving disc diaphragm 5 to the holding device 13, it then being fixed in its operating position 9. As already described above, the diaphragm exchange mechanisms and the lifting device 16' can be mounted in a dynamically decoupled fashion on different structures. Soft springs 17 of the lifting device 16' ensure a dynamically decoupled connection. The opening 29 in the projection objective 1 or the housing 1a is closed during operation.

Figure 9:
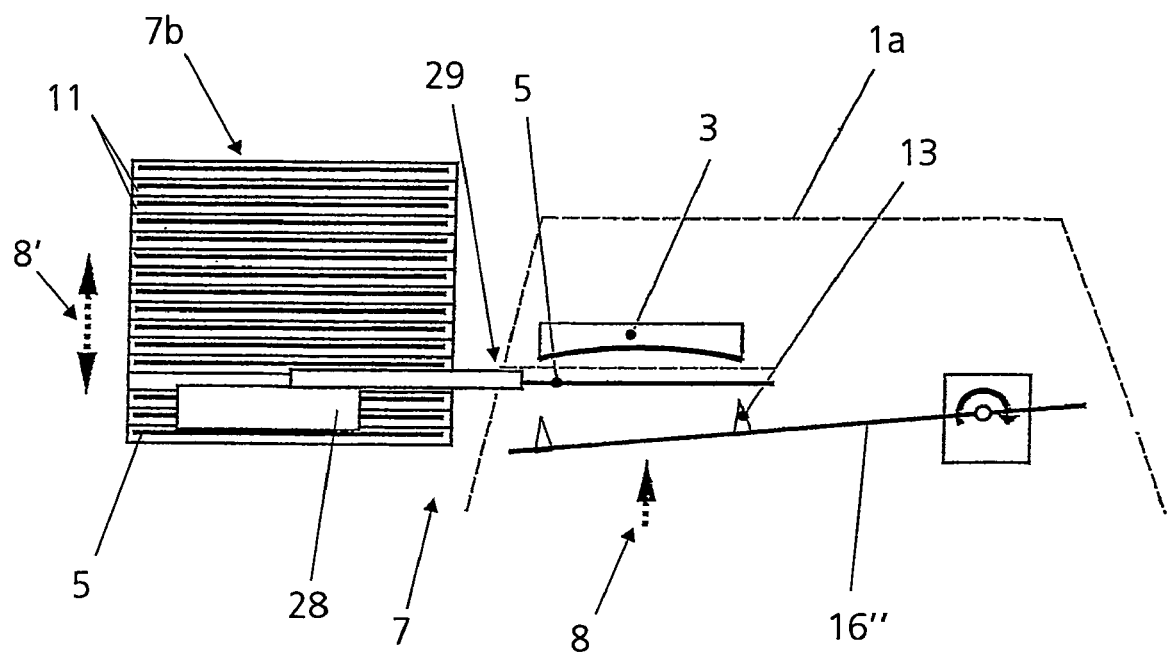
FIG. 9 shows a side view of a further embodiment of a diaphragm device with a lifting device.

In FIG. 9, a lifting device 16" is introduced and mounted inside the housing 1a of the projection objective 1. Surfaces which slide or roll on one another are reduced to an absolute minimum in order to avoid or to minimize particle contamination. This can be implemented by using solid joints and appropriate actuators (voice coil actuator, Lorentz actuator). Surfaces are minimized in order to avoid instances of molecular contamination and, moreover, use is made only of suitable materials with low degassing rates (steels, no plastics or lubricants). Lubrication on bearings can be dispensed with by using solid joints. The mass is to be kept small or the natural frequency of the lifting device 16" is to be kept as high as possible in order not to impair the structure of the projection optics dynamically.

As may further be seen from FIG. 9, the lifting device 16" has the holding device 13 for the revolving disc diaphragm 5. The revolving disc diaphragm 5 constructed as sheet metal is situated on the feeder device 28. The feeder device 28 brings the revolving disc diaphragm 5 into the projection optics below the mirror 3. The revolving disc diaphragm 5 is lifted from the feeder device 28 when the lifting device 16" is raised. The lifting device 16" drives against an inner stop. The revolving disc diaphragm 5 lies on the holding device 13 because of its own weight. Raising upwards can be prevented for example by means of a protective cover (compare FIG. 10a). The revolving disc diaphragm 5 cannot then fall out or collide with the mirror 3.

Figure 10A:
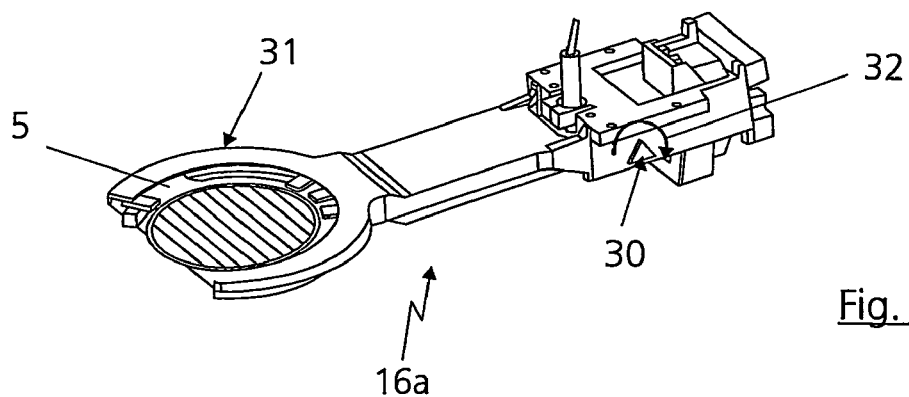
FIGS. 10a to 10c show perspective views of three embodiments of a lifting device.
Figure 10B:
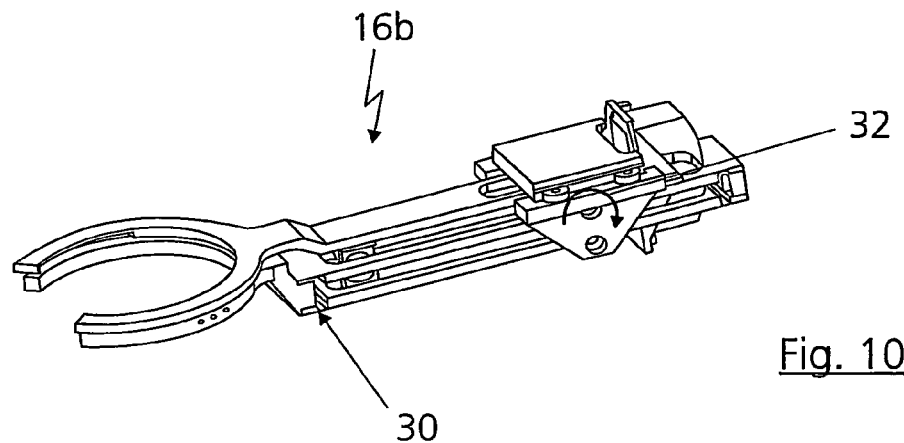
Figure 10C:
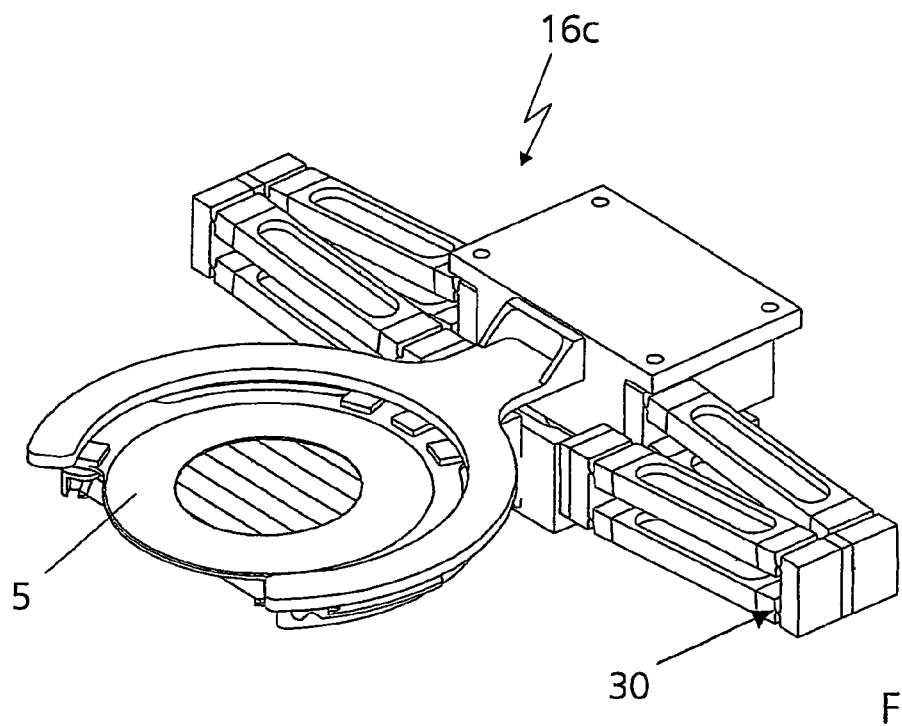

The following FIGS. 10a to 10c show structural configurations 16a, 16b, 16c of the lifting device 16" from FIG. 9. They have voice coil actuators (not shown in more detail) for manipulation. Rotary joints are respectively designed as solid joints 30.

As illustrated in FIG. 10a, a protective cover 31 prevents the lifting device 16a, constructed as a rocker, from raising the revolving disc diaphragm 5. The lifting devices 16a to 16c have internal end stops which prescribe the respective end positions of the lifting movement. The steering movement of the lifting device 16a is indicated by an arrow 32.

FIG. 10b shows the lifting device 16b, which is designed as a set of scales and has a parallelogram guide. It is advantageous in this case that the revolving disc diaphragm 5 can be moved upwards virtually vertically.

A pantographic lifting device 16c is sketched in FIG. 10c.

Figure 11:
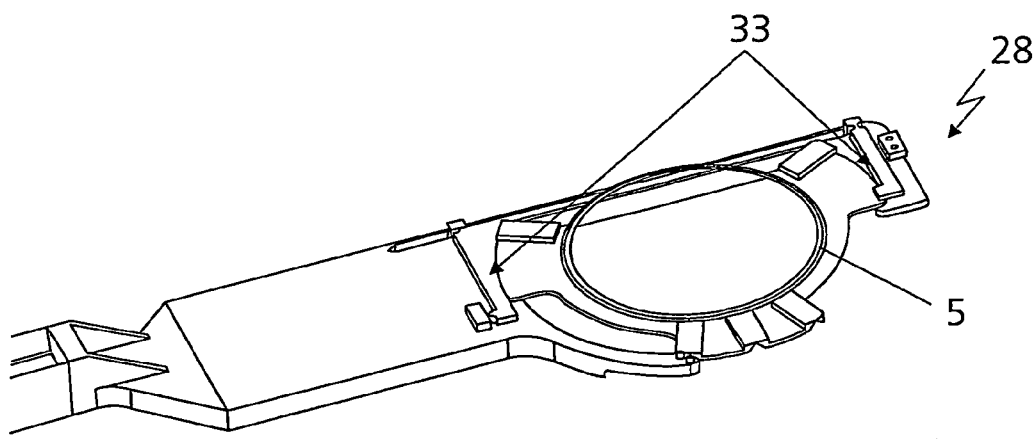
FIG. 11 shows a perspective view of a robot gripper arm for unloading a revolving disc diaphragm stack.

FIG. 11 shows the feeder device 28 designed as a robot gripper arm. The revolving disc diaphragm 5 can be withdrawn from below by the lifting device 16a, 16b, 16c from the receptacle of the feeder device 28. A locking mechanism 33 fastens the revolving disc diaphragm 5 during transport. In other exemplary embodiments the revolving disc diaphragm 5 can also be configured symmetrically such that fitting may be done from both sides. The feeder device 28 can, in addition, be designed as a double gripper, that is to say with two receptacles for two revolving disc diaphragms 5 (not illustrated). The time for changing diaphragms is thereby substantially shortened. During changing, the feeder device 28 moves with a revolving disc diaphragm 5 into the projection optics of the projection objective 1. The exchange revolving disc diaphragm 5, which is already located in the projection optics, is deposited on the second (empty) receptacle. The new revolving disc diaphragm 5 would be taken over by the lifting device 16a, 16b, 16c. During a change of diaphragm, the feeder device 28 would therefore have to move one less time into the projection optics.

Figure 12:
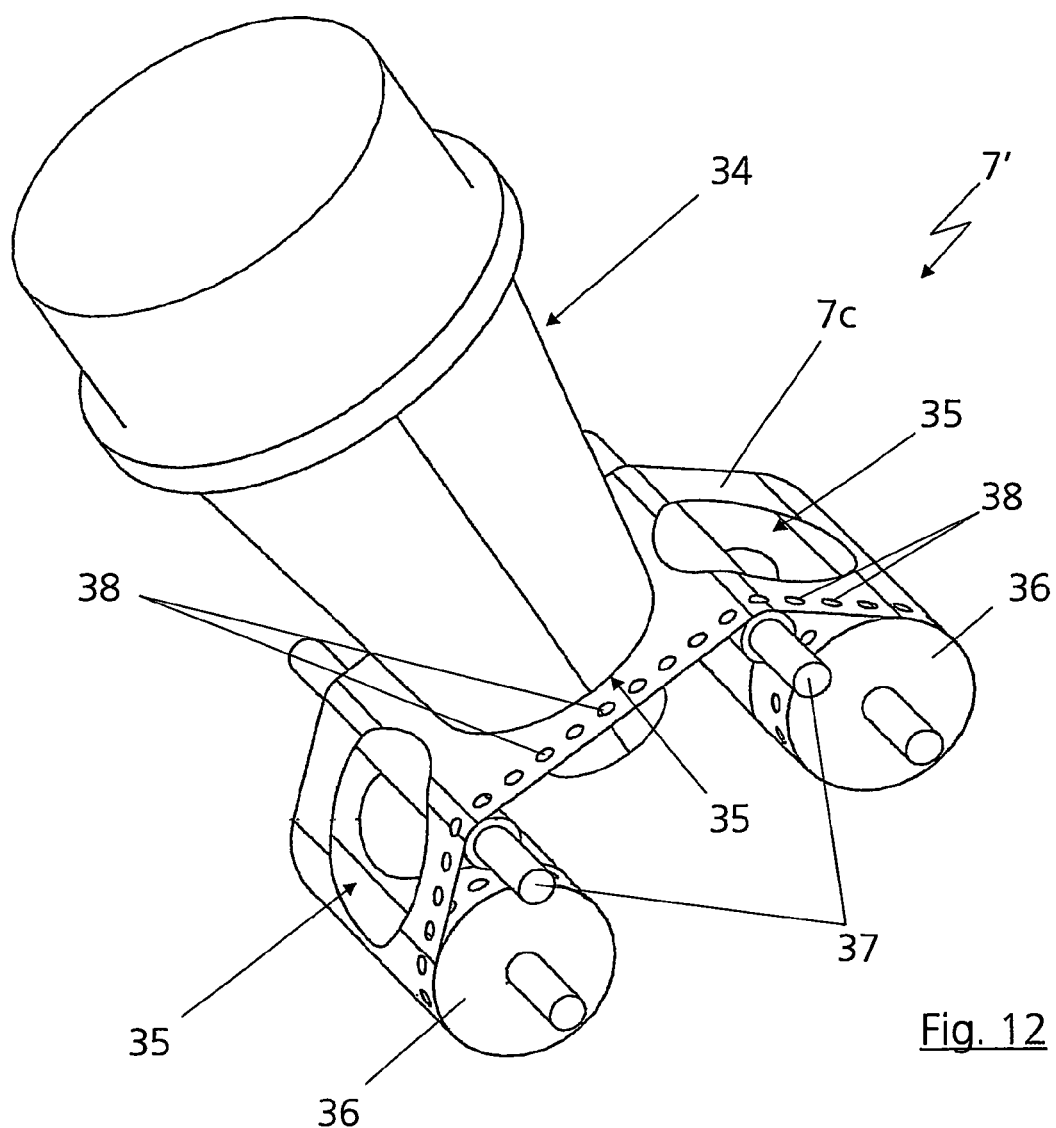
FIG. 12 shows a perspective view of a further embodiment of the diaphragm device with two rollers on which a sheet-metal strip is wound.

A further embodiment of a diaphragm device 7' for the projection objective 1 is illustrated in FIG. 12. The great advantage here is the improved dynamics of the change of diaphragm in conjunction with a small required installation space. As may be seen, an incident light beam 34 is stopped down by a sheet-metal strip 7c. The latter is provided with openings 35 which, depending on optical requirement exhibit an optimum fixed geometry. The further openings 35 are incised adjacently as diaphragms on the sheet-metal strip 7c. The sequence of the openings 35 can be varied in order to ensure optimum speed in changing diaphragms, depending on the requirements.

The sheet-metal strip 7c is wound onto two rollers 36. These are driven and tensioned such that the sheet-metal strip 7c has no "folds". Two additional tensioning and guiding rollers 37 are fitted in order to avoid diaphragms which shift in the light direction. As a result, the changing diameter of the rollers 36 (including wound-on sheet-metal strip 7c) is, in particular, not rendered noticeable by an oblique position of the sheet-metal strip 7c.

The optimum position of the diaphragm openings 35 can be measured, using appropriate sensors (not illustrated) via markings 38 at the edge of the sheet-metal strip 7c. However, other methods are also conceivable in further exemplary embodiments.

Figure 13:
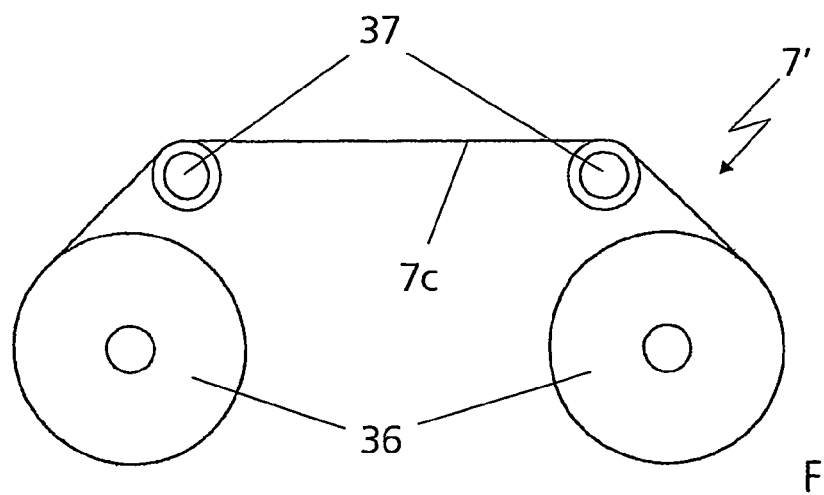
FIG. 13 shows a side view of the diaphragm device from FIG. 12.

A front view of the diaphragm device 7' from FIG. 12 is illustrated in FIG. 13.

As may be seen from FIG. 14, an EUV projection exposure machine 40 has a light source 41, an EUV illuminating system 42 for illuminating a field in the object plane 4 in which a pattern-bearing mask is arranged, and the projection objective 1 with the housing 1a and the beam path 2 (indicated by dashes) for imaging the pattern-bearing mask in the object plane 4 onto a photosensitive substrate 43. The diaphragm 5 for stopping down the projection objective 1 is indicated by dots.

What is claimed is:

1. An optical imaging device, in particular an objective for carrying out semiconductor microlithography at an extreme ultra-violet wavelength, said device comprising:
    a plurality of optical elements disposed in a beam path for a beam of extreme ultra-violet light;
    a plurality of diaphragms each of which has a respective diaphragm opening of a fixed geometry, said fixed geometry of said diaphragm openings being different in different respective ones of said diaphragms and,
    a diaphragm device for storing said diaphragms in a diaphragm store and selectively exchanging diaphragms between said diaphragm store and an operating position, said diaphragm openings of said diaphragms present in said diaphragm store being located out of the beam path, the said diaphragm opening of a said diaphragm present in said operating position being located in the beam path, whereby the objective can be selectively stopped down according to the said fixed geometry of the said diaphragm opening of any one of said diaphragms from said diaphragm store which is selectively introduced into said operating position.

2. An optical imaging device according to claim 1, wherein said diaphragm store comprises a revolving disc diaphragm stack and said plurality of diaphragms comprises a plurality of individual revolving disc diaphragms which are provided with said diaphragm openings.

3. An optical imaging device, according to claim 2, wherein said optical imaging device further comprises a housing within which said optical elements are located and, said revolving disc diaphragm stack is located outside of said housing.

4. An optical imaging device according to claim 2, wherein said diaphragm store further comprises a plurality of separate plug-in units and individual ones of said revolving disc diaphragms are stored in said revolving disc diaphragm stack in respective individual ones of said separate plug-in units.

5. An optical imaging device according to claim 2, wherein said housing includes an opening through which said diaphragms are exchanged between said diaphragm store and said operating position said revolving disc diaphragm stack is displaceable relative to said opening in said housing for positioning any selected one of said revolving disc diaphragms for introduction into said operating position by way of said opening.

6. An optical imaging device according to claim 4, wherein said diaphragm device further comprises a feeder device which removes a said revolving disc diaphragm from a said separate plug-in unit of said revolving disc diaphragm stack, introduces said revolving disc diaphragm into the beam path, and re-deposits said revolving disc diaphragm in said revolving disc diaphragm stack after said revolving disc diaphragm has been used in said operating position.

7. An optical imaging device according to claim 6, wherein said feeder device comprises a moveable robot gripper arm.

8. An optical imaging device according to claim 2, wherein said diaphragm device has a lifting device for positioning said revolving disc diaphragm in the beam path.

9. An optical imaging device according to claim 2, wherein said diaphragm device has a holding device for fixing said revolving disc diaphragm in the beam path.

10. An optical imaging device according to claim 2, wherein one of said optical elements has a holding device for fixing said revolving disc diaphragm in the beam path.

11. An optical imaging device according to claim 2, wherein said diaphragm device has a lifting device which is provided with, a holding device for fixing said revolving disc diaphragm in the beam path.

12. An optical imaging device according to claim 9, wherein said lifting device is pressed against said holding device by spring elements for the purpose of dynamically decoupling said revolving disc diaphragm from said optical imaging device.

13. An optical imaging device according to claim 9, wherein for the purpose of dynamically decoupling said revolving disc diaphragm from said optical imaging device, said revolving disc diaphragm can be fixed on said holding device via magnetic forces.

14. An optical imaging device according to claim 8, wherein said lifting device is dynamically decoupled.

15. An optical imaging device according to claim 2, further comprising a housing within which said optical elements are located, said housing having an opening through which said revolving disc diaphragms are introduced into the beam path.

16. An optical imaging device according to claim 1, wherein said diaphragm device is dynamically decoupled.

17. An optical imaging device according to claim 7, wherein said diaphragm device has a lifting device for positioning said revolving disc diaphragm in the beam path and wherein said lifting device picks up said revolving disc diaphragm from said robot gripper arm.

18. An optical imaging device according to claim 7, wherein said lifting device moves said revolving disc diaphragm according to a rocking steering movement.

19. An optical imaging device according to claim 8, wherein said lifting device is designed as a set of scales, in particular with a parallelogram guide.

20. An optical imaging device according to claim 8, wherein said lifting device is of pantographic design, in particular having solid joints.

21. An optical imaging device according to claim 1, wherein a sheet-metal strip which is wound onto two rollers and held tensioned is provided as a diaphragm store, said sheet-metal strip having a plurality of, in particular, various diaphragm openings of fixed shapes, and it being possible by rotating said rollers to adjust said diaphragm setting by varying the diaphragm openings.

22. An optical imaging device according to claim 21, wherein the tension of said sheet-metal strip, and the height of said diaphragm opening, are kept constant by at least two additional guide rollers, which cause a resilient pretensioning, the first roller being arranged in a fixed fashion, and the second being supported flexibly in the spacing direction.

23. An optical imaging device according to claim 21, wherein the position of said diaphragm openings can be determined by markings, in particular by cut-outs, at the edge of said sheet-metal strip.

24. A diaphragm device for stopping down an objective of the type used for carrying out semiconductor microlithography with a beam of extreme ultra-violet light directed along a beam path, said diaphragm device comprising:
a plurality of diaphragms each of which has a respective diaphragm opening of a fixed geometry, said fixed geometry of said diaphragm openings being different in different respective ones of said diaphragms;
a diaphragm store for storing said diaphragms such that said diaphragm openings of said diaphragms present in said diaphragm store are not in the beam path, and a diaphragm exchange mechanism for selectively exchanging said diaphragms between said diaphragm store and an operating position in the objective, said operating position being a position wherein the said diaphragm opening of a said diaphragm present in said operating position is located in the beam path, whereby the objective can be selectively stopped down according to the said fixed geometry of the said diaphragm opening of whichever one of said diaphragms from said diaphragm store is selectively introduced into said operating position.

25. An optical imaging device, in particular an objective of the type used for carrying out semiconductor microlithography at an extreme ultra-violet wavelength, said device comprising:
a plurality of optical elements disposed in a beam path for a beam of extreme ultra-violet light;
a diaphragm device having a diaphragm store which includes a plurality of individual diaphragms each of said diaphragms having a fixed diaphragm opening, said fixed diaphragm opening being different in different respective ones of said diaphragms, and
a lifting device for positioning said fixed diaphragm opening of a selected one of said diaphragms in the beam path.

26. An optical imaging device, in particular an objective for carrying out semiconductor microlithography at an extreme ultra-violet wavelength, said device comprising:
a plurality of optical elements arranged for directing a beam of light of extreme ultra-violet wavelength along a beam path to project an image of a mask onto a substrate;
a plurality of diaphragms each of which has a diaphragm opening of a fixed shape, said fixed shape being different in different respective ones of said diaphragms, and
a diaphragm device having a diaphragm store for storing said diaphragms in a stack, and for introducing into the beam path the said diaphragm opening of said diaphragm from said stack.

* * * * *

UNITED STATES PATENT AND TRADEMARK OFFICE
CERTIFICATE OF CORRECTION

PATENT NO. : 7,684,125 B2 Page 1 of 1
APPLICATION NO. : 10/595583
DATED : March 23, 2010
INVENTOR(S) : Hermann Bieg et al.

It is certified that error appears in the above-identified patent and that said Letters Patent is hereby corrected as shown below:

Column 10, line 23
 delete "abeam" and insert --a beam--

Signed and Sealed this

Thirteenth Day of July, 2010

David J. Kappos
*Director of the United States Patent and Trademark Office*